United States Patent
Matsuzoe et al.

(10) Patent No.: US 9,772,357 B1
(45) Date of Patent: Sep. 26, 2017

(54) DIAGNOSTIC APPARATUS

(71) Applicant: FUJI ELECTRIC CO., LTD., Kanagawa (JP)

(72) Inventors: Yuji Matsuzoe, Tokyo (JP); Tsuyoshi Inoue, Tokyo (JP)

(73) Assignee: FUJI ELECTRIC CO., LTD., Kawasaki-shi, Kanagawa (JP)

(*) Notice: Subject to any disclaimer, the term of this patent is extended or adjusted under 35 U.S.C. 154(b) by 0 days.

(21) Appl. No.: 15/414,712

(22) Filed: Jan. 25, 2017

(30) Foreign Application Priority Data

Mar. 16, 2016 (JP) .................. 2016-052250

(51) Int. Cl.
| | | |
|---|---|---|
| G01R 31/14 | (2006.01) | |
| G01R 21/08 | (2006.01) | |
| H02P 27/06 | (2006.01) | |
| H02K 11/215 | (2016.01) | |
| G01R 31/28 | (2006.01) | |
| B26D 7/22 | (2006.01) | |

(52) U.S. Cl.
CPC .............. G01R 21/08 (2013.01); B26D 7/22 (2013.01); G01R 31/282 (2013.01); H02K 11/215 (2016.01); H02P 27/06 (2013.01)

(58) Field of Classification Search
CPC .... G01R 31/025; G01R 31/02; G01R 19/145; G01R 31/2829; G01R 31/14; G01R 31/343; G01R 31/34; G01R 31/346; G01R 31/006; G01P 3/48; G01P 3/46; G01P 3/44; G01P 3/42; G01P 3/465
USPC ...................... 324/511, 765.01, 177
See application file for complete search history.

(56) References Cited

U.S. PATENT DOCUMENTS 6,035,265 A * 3/2000 Dister .................. G01R 31/343
                                             324/765.01
6,720,761 B1 * 4/2004 Doi ........................ G01R 33/07
                                             324/207.2
(Continued)

FOREIGN PATENT DOCUMENTS

| JP | H10-032962 | 2/1998 |
| JP | 2000-078881 | 3/2000 |

(Continued)

OTHER PUBLICATIONS

Japanese Office Action dated Apr. 12, 2016.
Japanese Office Action dated Jul. 5, 2016.

*Primary Examiner* — Thang Le
(74) *Attorney, Agent, or Firm* — IPUSA, PLLC (57) ABSTRACT

A diagnostic apparatus that diagnoses a cutter tool or a rotating machine based on electric power supplied to the rotating machine, includes: an electric power measurement unit that measures the electric power; and a filtering unit that filters noises input from an input side and an output side of the electric power measurement unit, the electric power measurement unit including a Hall element, and applied voltage of an electric power supply line, that supplies the electric power to the rotating machine from an inverter or a servo amplifier, is input in the Hall element, wherein the electric power is calculated based on Hall voltage that is generated, when Hall current flows through the Hall element and magnetic flux is applied to a sensor surface of the Hall element, the Hall voltage being proportional to a product of the magnetic flux and the Hall current.

10 Claims, 6 Drawing Sheets

(56) References Cited

U.S. PATENT DOCUMENTS

| | | | | |
|---|---|---|---|---|
| 8,471,553 | B2* | 6/2013 | Tategami | G01D 5/2033 |
| | | | | 324/207.25 |
| 9,634,593 | B2* | 4/2017 | Marcinkiewicz | H02P 6/21 |
| 2007/0036625 | A1* | 2/2007 | Kato | B23Q 1/0009 |
| | | | | 409/230 |
| 2011/0232988 | A1* | 9/2011 | Aoki | G01L 25/003 |
| | | | | 180/446 |
| 2013/0002214 | A1 | 1/2013 | Chiu | |
| 2015/0123578 | A1* | 5/2015 | Schulz | H02P 23/14 |
| | | | | 318/400.04 |
| 2016/0036300 | A1* | 2/2016 | Zhao | H02K 11/001 |
| | | | | 318/400.21 |
| 2016/0190964 | A1* | 6/2016 | Shin | H02P 21/145 |
| | | | | 318/490 |

FOREIGN PATENT DOCUMENTS

| | | |
|---|---|---|
| JP | 2000-152689 | 5/2000 |
| JP | 2001-210893 | 8/2001 |
| JP | 2007-198904 | 8/2007 |
| JP | 2011-200073 | 10/2011 |

\* cited by examiner

DIAGNOSTIC APPARATUS

CROSS-REFERENCE TO RELATED APPLICATION

The present application is based on and claims the benefit of priority of Japanese Priority Application No. 2016-052250 filed on Mar. 16, 2016, the entire contents of which are hereby incorporated by reference.

BACKGROUND OF THE INVENTION

1. Field of the Invention

The present invention relates to a diagnostic apparatus.

2. Description of the Related Art

A machine tool using a motor or the like is known. Further, a following method is known for detecting a defect of a motor of a machine tool.

First, electric power supplied to a motor that periodically drives an operation unit in a machine tool is measured, and data of the electric power measured every drive cycle period of the operation unit are recorded. Next, a rate of change between current electric power data and previous last electric power, which is recorded previously, is calculated, and a defect of the operation unit is detected based on the calculated rate of change (Patent Document 1 or the like, for example).

However, according to the above described method, noises may affect in controlling or the like of the rotating machine.

PATENT DOCUMENT

[Patent Document 1] Japanese Patent No. 3,783,191

SUMMARY OF THE INVENTION

The present invention is made in light of the above problems, and to reduce influence of noises in controlling or the like of a rotating machine.

According to an embodiment, there is provided a diagnostic apparatus that diagnoses a cutter tool included in a rotating machine or the rotating machine based on electric power supplied to the rotating machine, including: an electric power measurement unit that measures the electric power; and a filtering unit that filters noises input from an input side of the electric power measurement unit and an output side of the electric power measurement unit, the electric power measurement unit including a Hall element, and applied voltage of an electric power supply line, that supplies the electric power to the rotating machine from an inverter or a servo amplifier, is input in the Hall element, wherein the electric power is calculated based on Hall voltage that is generated, when Hall current flows through the Hall element based on the applied voltage, and magnetic flux that is proportional to applied current to the rotating machine is applied to a sensor surface of the Hall element, the Hall voltage being proportional to a product of the magnetic flux and the Hall current.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

(1. Example of Overall Structure)

Figure 1:
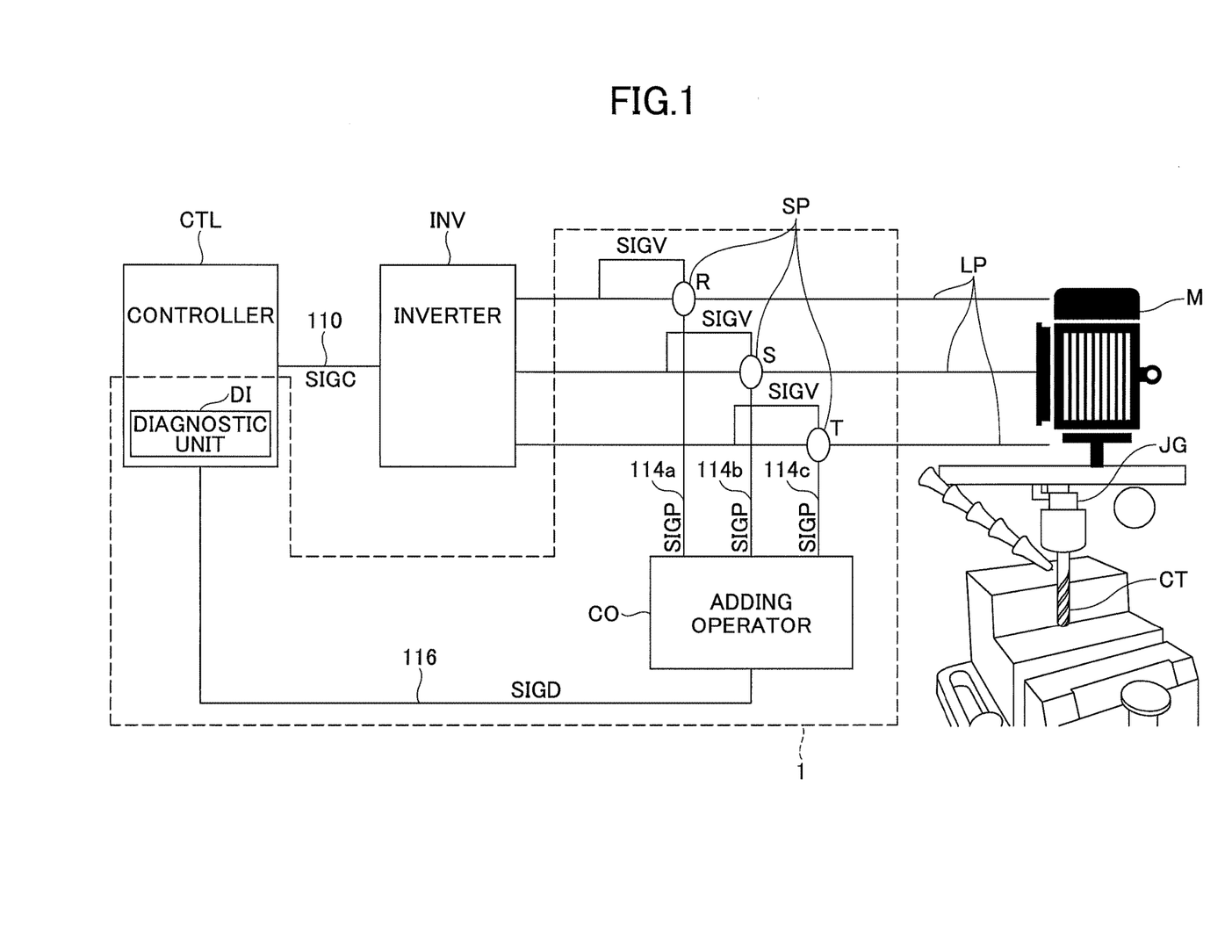
FIG. 1 is a schematic view illustrating an example of an overall structure including a diagnostic apparatus of an embodiment.

FIG. 1 is a schematic view illustrating an example of an overall structure including a diagnostic apparatus 1 of the embodiment. For example, the diagnostic apparatus 1 is used in the illustrated structure. Specifically, with reference to FIG. 1, electric power is supplied from an inverter INV to a motor M, which is an example of a rotating machine, via electric power supply lines LP, which are an example of an electric power supplying unit. Hereinafter, the illustrated structure is described as an example.

The motor M rotates a processing cutter tool CT such as a milling cutter or a drill attached by a cutter tool attaching jig JG. When the rotated processing cutter tool CT contacts a workpiece such as a metal (not illustrated in the drawings), the workpiece is processed such as it is cut, or a hole is formed by the processing cutter tool CT. As such, the motor M processes the workpiece by rotating the processing cutter tool CT by using the electric power supplied from the inverter INV or a servo amplifier (not illustrated in the drawings).

Further, the motor M may rotate the workpiece by fixing the workpiece by a jig or the like of the motor M. In such a case, the processing cutter tool CT contacts the rotating workpiece and the workpiece is processed.

A controller CTL such as a Programmable Logic Controller (PLC) is connected to the inverter INV via a signal line 110. The controller CTL controls the inverter INV, the servo amplifier or the like by a control signal SIGC. Specifically, the controller CTL controls speed by controlling revolution speed of the motor M, controls a position of the motor M or the like. Further, the controller CTL includes a diagnostic unit DI. As illustrated in FIG. 1, the diagnostic unit DI diagnoses the motor M or the processing cutter tool CT based on calculated electric power signal SIGD or the like. This diagnosis is described later in detail.

Further, in the illustrated example, the inverter INV is connected to the electric power supply lines LP. Further, the diagnostic apparatus 1 includes electric power sensors SP (illustrated as "R", "S" and "T" as well), which are an example of an electric power measurement unit. The electric power sensor SP is provided for each of the electric power supply lines LP and is connected to the electric power supply line LP. Each of the electric power sensors SP captures a voltage signal SIGV which indicates applied voltage on the respective electric power supply line LP. The electric power sensor SP includes a Hall element, for example. The electric power sensor SP is described in detail later. An adding operator CO is connected to the electric power sensors SP via signal lines 114a, 114b and 114c, respectively. The adding operator CO adds the electric power measured by each of the electric power sensors SP. Specifically, as illustrated in FIG. 1, for the motor M of three phases, the adding operator CO adds the three electric powers.

Figure 2:
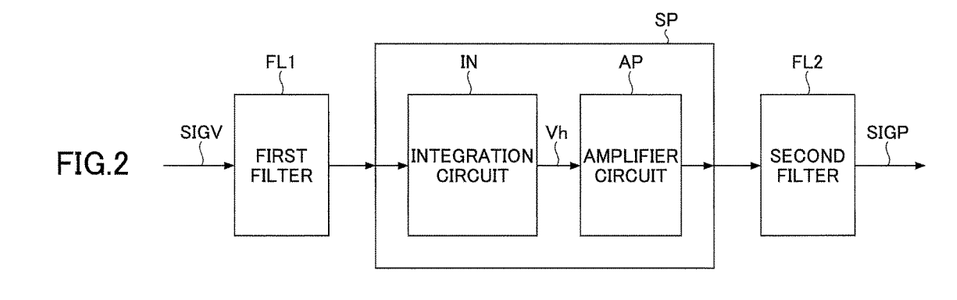
FIG. 2 is a block diagram illustrating an example of a structure of an electric power measurement unit and a filtering unit of the diagnostic apparatus of the embodiment.

FIG. 2 is a block diagram illustrating a structure of the electric power measurement unit and a filtering unit of the diagnostic apparatus 1 of the embodiment. As illustrated in FIG. 2, each of the electric power sensors SP includes an integration circuit IN and an amplifier circuit AP. As illustrated in FIG. 2, the diagnostic apparatus 1 includes a first filter FL1 provided at an input side of the electric power sensor SP, as an example of a filtering unit, and a second filter FL2 provided at an output side of the electric power sensor SP, for example. In the diagnostic apparatus 1, the adding operator CO (see FIG. 1) may further include a filter in addition to the first filter FL1 and the second filter FL2.

The integration circuit IN is actualized by a Hall element (a magnetic sensor) or the like, for example. Specifically, the integration circuit IN is a following circuit, for example.

Figure 3:
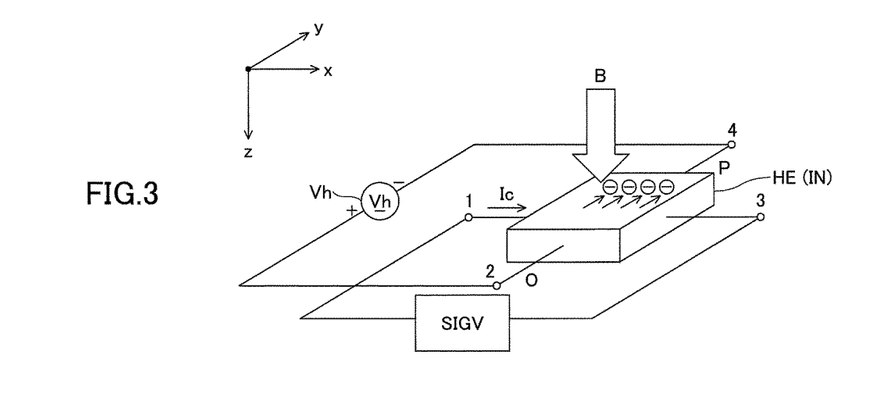
FIG. 3 is a view illustrating an example of an integration circuit of the diagnostic apparatus of the embodiment.

FIG. 3 is a view illustrating an example of the integration circuit IN of the diagnostic apparatus 1 of the embodiment. As the illustrated example, the integration circuit IN is configured by using a Hall element HE that detects magnetism. In other words, the integration circuit IN calculates the electric power by so-called Hall multiplication. The Hall element HE includes four terminals (electrodes) as illustrated by "1", "2", "3" and "4". Here, the terminals "1" and "3" are provided in an "x" direction, the terminals "2" and "42 are provided in a "y" direction, and a sensor surface of the Hall element HE is provided to face in a "z" direction, which are perpendicular to each other.

Specifically, when electric power is supplied by the respective electric power supply line LP (see FIG. 1), first, the electric power supplied by the electric power supply line LP is applied between input terminals (illustrated by "1" and "3" in FIG. 3) of the Hall element HE in the integration circuit IN. The applied voltage of the electric power supplied by the electric power supply line LP between the input terminals is indicated as a voltage signal SIGV. Thus, current (hereinafter, referred to as "Hall current Ic") that is proportional to the applied voltage of the electric power supplied by the electric power supply line LP flows between the input terminals of the Hall element HE. In other words, the current that is proportional to the voltage indicated by the voltage signal SIGV flows between the input terminals of the Hall element HE.

Next, at this time, magnetic flux B that is proportional to applied current of the electric power supplied by the electric power supply line LP (see FIG. 1), in other words, applied current to the motor M, is applied to the sensor surface of the Hall element HE in the integration circuit IN.

With this, voltage (hereinafter, referred to as "Hall voltage Vh") that is proportional to a product of the magnetic flux B and the Hall current Ic is generated between output terminals (illustrated by "2" and "4" in FIG. 3) of the Hall element HE in the integration circuit IN. Then, the integration circuit IN is configured to output a signal indicating the Hall voltage Vh to the amplifier circuit AP (see FIG. 2).

Here, the first filter FL1 is connected to an input signal line of the Hall element HE and the second filter FL2 is connected to an output signal line of the Hall element HE.

Referring back to FIG. 2, the amplifier circuit AP amplifies the signal indicating Hall voltage Vh to generate a signal indicating electric power (hereinafter, referred to as "detected electric power signal SIGP"). In other words, the amplifier circuit AP amplifies an input signal to become a predetermined voltage level.

With reference to FIG. 1, these processes are performed in each of the sensors SP. Then, the adding operator CO adds the detected electric power signal SIGP of each phase. In other words, for the motor M of three phases, the adding operator CO adds the electric power indicated by the three detected electric power signals SIGP. Next, the adding operator CO sends the calculated result, in other words, the calculated electric power signal SIGD or the like that indicates the electric power supplied to the motor M (see FIG. 1) or the like, to the controller CTL or the like via a signal line 116. The controller CTL may control various operations based on the calculated electric power signal SIGD. Further, the following diagnosis is performed by using the calculated electric power signal SIGD, for example.

Figure 4:
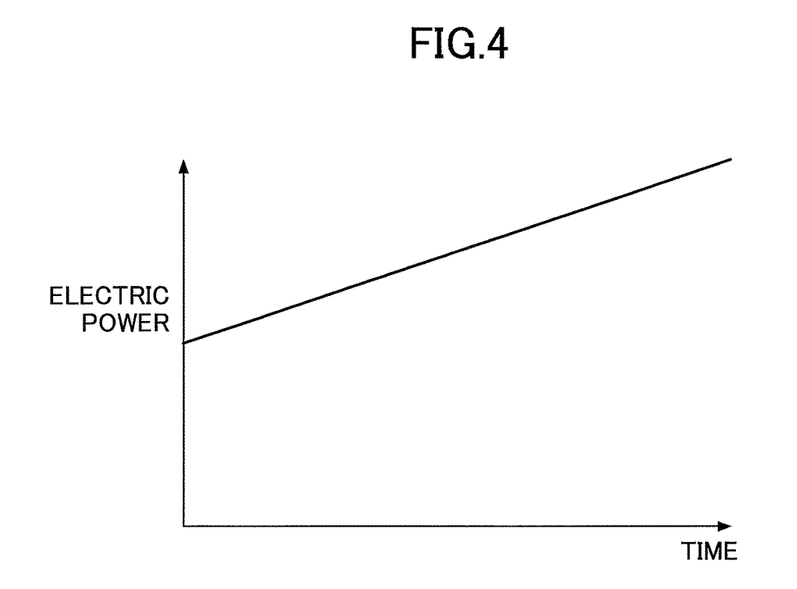
FIG. 4 is a view illustrating an example of a diagnosis using a calculated electric power signal of the embodiment.

FIG. 4 is a view illustrating an example of a diagnosis using the calculated electric power signal SIGD of the embodiment. The graph of FIG. 4 illustrates an example the calculated electric power signal SIGD with respect to time, in which an axis of ordinates indicates the calculated electric power signal SIGD and an axis of abscissas indicates time. Here, as described above, the calculated electric power signal SIGD (see FIG. 1) is a result obtained by adding the detected electric power signal SIGP of each of the phases, in other words, the electric power supplied to the motor M (see FIG. 1).

As illustrated in FIG. 4, as the process time passes, the electric power increases due to the ablation of the cutter tool CT. Thus, the diagnostic unit DI may diagnose whether the cutter tool CT is ablated based on whether the calculated electric power signal SIGD is greater than or equal to a previously set predetermined value. Alternatively, the diagnostic apparatus 1 may diagnose as follows based on the calculated electric power signal SIGD.

Figure 5:
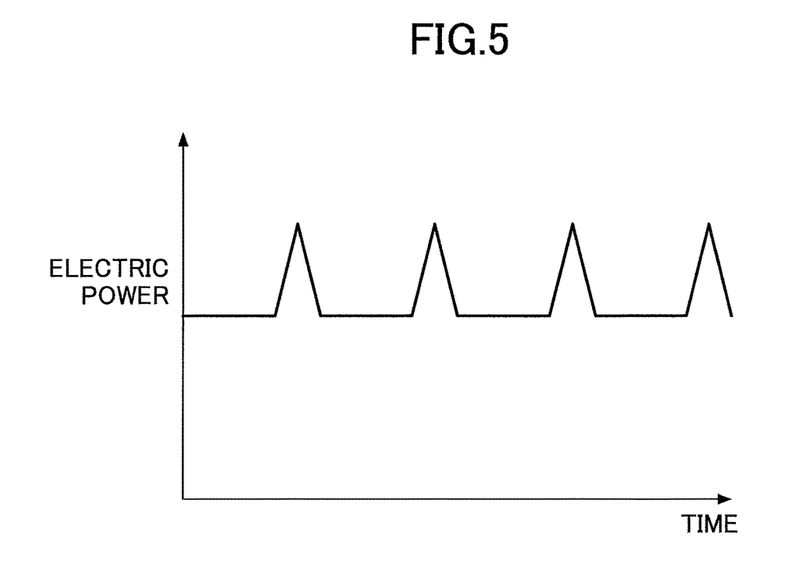
FIG. 5 is a view illustrating another example of the diagnosis using the calculated electric power signal of the embodiment.

FIG. 5 is a view illustrating another example of the diagnosis using the calculated electric power signal SIGD of the embodiment. Similar to FIG. 4, the graph of FIG. 5 illustrates an example the calculated electric power signal SIGD with respect to time, in which an axis of ordinates indicates the calculated electric power signal SIGD and an axis of abscissas indicates time. Here, as described above, the calculated electric power signal SIGD (see FIG. 1) is a result obtained by adding the detected electric power signal SIGP of each of the phases, in other words, the electric power supplied to the motor M (see FIG. 1).

For example, when a portion of the cutter tool CT is accidentally chipped, the chipped portion of the cutter tool CT may interfere with the workpiece in processing. When such interference occurs, as illustrated in FIG. 5, the value of the calculated electric power signal SIGD periodically becomes high in accordance with the chipped portion of the cutter tool CT. Thus, when a wave pattern as illustrated in FIG. 5 is observed, the diagnostic unit DI may diagnose that the portion of the cutter tool CT is chipped or the like. The wave pattern as illustrated in FIG. 5 is often periodically observed every rotation of the cutter tool CT. Thus, it is desirable that the diagnostic apparatus 1 is configured to measure the electric power at a high speed.

Hereinafter, with reference to FIG. 1, an example is described in which the motor M rotates the cutter tool CT at 3600 rpm (revolutions per minute), in other words, at 60 rps (revolutions per second). For this example, a rotation period is about $\frac{1}{60}$=16.666 . . . msec≈15 msec (hereinafter, it is assumed that a rotation period is 15 msec).

Further, in this example, it is assumed that a portion of the cutter tool CT for 5° is damage. This means that when the cutter tool rotates one cycle, in other words, rotates for 360°, a portion 5°/360°=$\frac{1}{72}$ is damaged. In such a case, the wave pattern that indicates the damaged portion has a pulse width about 15 msec×($\frac{1}{72}$)=0.208333 . . . msec=208.333 . . . μsec≈200 μsec (hereinafter, it is assumed that the pulse width of the wave pattern that indicates the damaged portion is 200 μsec). Then, in order to measure (detect) such a wave pattern, the diagnostic apparatus 1 may be configured to measure at resolution about less than or equal to ½ of the targeted measuring pulse width, based on a sampling theorem. It is preferable that the resolution of the diagnostic apparatus 1 is about less than or equal to ⅕ of the targeted measuring pulse width. More preferably, the resolution of the diagnostic apparatus 1 is about less than or equal to $\frac{1}{10}$ of the targeted measuring pulse width. This means that, when measuring the wave pattern of a pulse width about 200 μsec, it is preferable that the diagnostic apparatus 1 (the electric power measurement unit) can measure at resolution of speed about less than or equal to 15 to 20 μsec. The resolution may be set based on the angle or the like of a targeted damaged portion of the targeted cutter tool CT.

In order to measure at such a high speed, it is desirable to have a structure using a circuit or the like, as illustrated in FIG. 2. In other words, by adopting the structure as illustrated in FIG. 2, the diagnostic apparatus 1 can measure the electric power at a high speed.

Alternatively, the diagnostic apparatus 1 may detect a defect of the rotating machine such as the motor M. For example, when the electric power is greater than or equal to the previously set predetermined value, the defect may be generated in the motor M. Specifically, when the motor M interferes with something, a large torque is generated in order to rotate the motor M, and large current may flow. In such a case, the electric power also increases in accordance with the current. As such, the diagnostic apparatus 1 may detect the defect of the motor M.

Further, with reference to FIG. 2, it is desirable that the noises filtered by the first filter FL1 (see FIG. 2) and the second filter FL2 (see FIG. 2) are 60 MHz to 80 MHz when the applied voltage is 10V, and 150 MHz to 200 MHz when 10 V/m.

Magnetic noises (referred to as "electric power noises" as well) mainly generated by the motor M (see FIG. 1) or the like often affect the voltage signal SIGV (see FIG. 2) or the like. Further, radio noises mainly generated by the inverter INV (see FIG. 1) or the like often affect the voltage signal SIGV or the like. In particular, in a structure in which the electric power sensors SP (see FIG. 1), the adding operator CO, the motor M and the inverter INV are provided in the vicinity with each other in order to miniaturize the machine tool or the like, influence of the noises tend to be large. Further, when a switching power supply is used, power supply noises due to the switching power supply or the like may affect as well. Thus, by filtering the noises of the above described frequency band at the input side of the electric power sensor SP, in other words, by the first filter FL1, the diagnostic apparatus 1 can reduce the influence of the noises.

Further, as illustrated in FIG. 2, it is desirable that the noises are filtered at the output side of the electric power sensor SP, in other words, by the second filter FL2. At the output side, noises from a device or the like connected at the output side tend to enter. Thus, by providing the second filter FL2, the diagnostic apparatus 1 can filter the noises that enter from the output side and the influence of the noises can be reduced.

With the structure of the above described electric power measurement unit and the filtering unit, the following processes can be performed.

Figure 6:
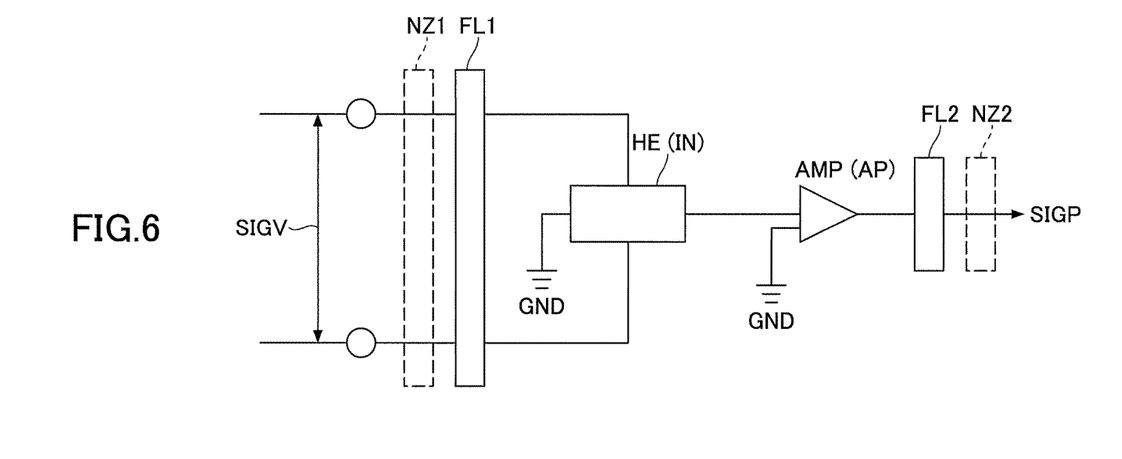
FIG. 6 is a view illustrating an example of an equivalent circuit of the electric power measurement unit and the filtering unit of the diagnostic apparatus of the embodiment.

FIG. 6 is a view illustrating an example of an equivalent circuit of the electric power measurement unit and the filtering unit of the diagnostic apparatus 1 of the embodiment. The structure illustrated in FIG. 2 may be illustrated as a circuit diagram of FIG. 6, for example.

First, the voltage indicated by the voltage signal SIGV is input. Next, when the voltage based on the voltage signal SIGV is input, Hall current Ic (see FIG. 3) is generated. Further, when the magnetic flux B that is proportional to the applied current flowing through the electric power supply line LP is applied to the Hall element HE, the Hall element HE outputs Hall voltage Vh that is a product of the magnetic flux B and the Hall current Ic (see FIG. 3), that indicates the electric power. Then the signal that indicates the Hall voltage Vh is amplified by the amplifier AMP, and the detected electric power signal SIGP that indicates the electric power is output.

Here, when the first filter FL1 is provided, noises (hereinafter, referred to as a "first noise NZ1") that affect the voltage signal SIGV are filtered and the influence of the noises can be reduced. The first noise NZ1 is an example of the noises included in applied voltage to the motor M input to the electric power measurement unit. Similarly, when the second filter FL2 is provided, noises (hereinafter, referred to as a "second noise NZ2") that affect the detected electric power signal SIGP are filtered and the influence of the noises can be reduced. The second noise NZ2 is an example of the noises that enters from the output side of the electric power measurement unit. As such, when the diagnostic apparatus 1 includes the filters to surround the Hall element HE or the like, the diagnostic apparatus 1 can reduce the various noises such as the first noise NZ1 and the second noise NZ2, and the influence of the noises can be reduced.

Further, it is preferable that the diagnostic apparatus 1 includes a magnetism collection core as described in the following in order to efficiently generate the magnetic flux B, for example.

Figure 7:
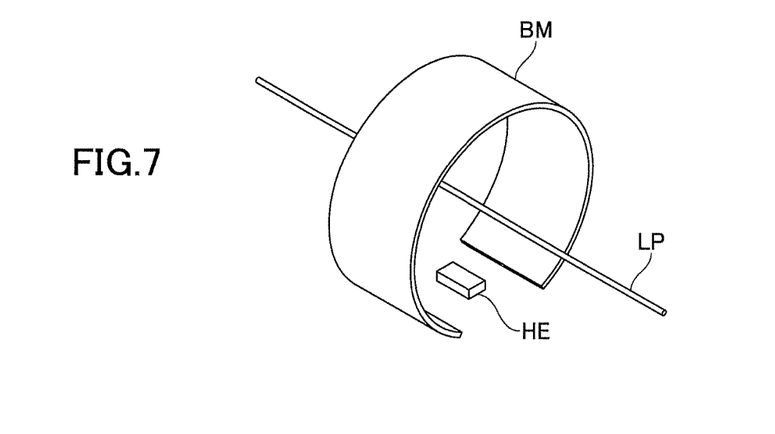
FIG. 7 is a view illustrating an example of a magnetism collection core of the diagnostic apparatus of the embodiment.

FIG. 7 is a view illustrating an example of a magnetism collection core of the diagnostic apparatus 1 of the embodiment. As illustrated in FIG. 7, the magnetism collection core includes a magnetic material BM such as ferrite or permalloy. The magnetic material BM is provided to cover the electric power supply line LP. Further, the magnetic material BM is provided with a cutout portion, and the Hall element HE is provided at the cutout portion. The sensor surface of the Hall element HE is provided to face the magnetic material BM. When such a magnetism collection core is used, the magnetism collection core functions as a shield, and the diagnostic apparatus 1 can reduce an influence by a disturbance noise.

(2. Example of Functional Structure of Diagnostic Apparatus)

Figure 8:
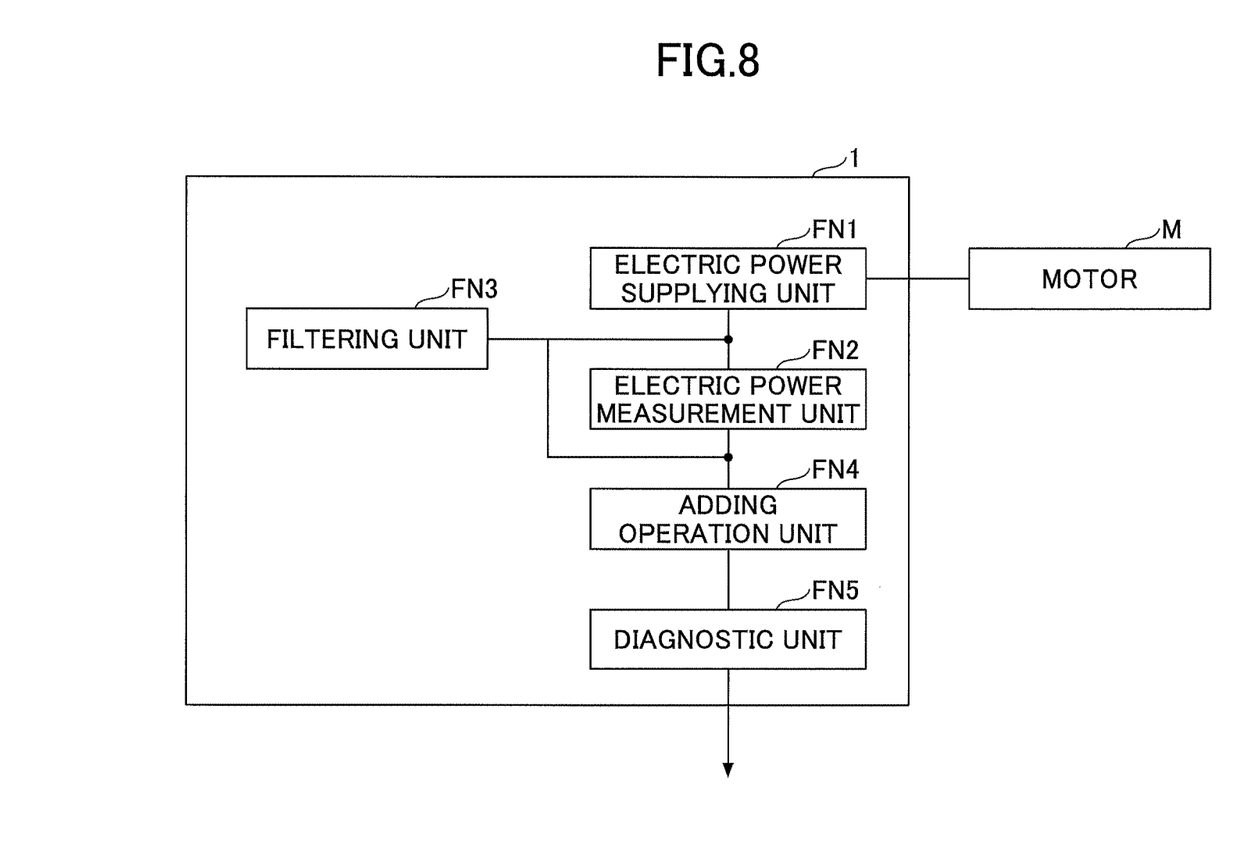
FIG. 8 is a functional block diagram illustrating an example of a functional structure of the diagnostic apparatus of the embodiment.

FIG. 8 is a functional block diagram illustrating an example of a functional structure of the diagnostic apparatus 1 of the embodiment. The diagnostic apparatus 1 includes an electric power supplying unit FN1, an electric power measurement unit FN2, a filtering unit FN3, an adding operation unit FN4 and a diagnostic unit FN5.

The electric power supplying unit FN1 supplies the electric power to the rotating machine such as the motor M. The electric power supplying unit FN1 is actualized by the electric power supply lines LP (see FIG. 1) or the like, for example.

The electric power measurement unit FN2 measures the electric power supplied by the electric power supplying unit FN1. The electric power measurement unit FN2 is actualized by the electric power sensors SP (see FIG. 1) or the like, for example.

The filtering unit FN3 filters the noises included in the signal input to the electric power measurement unit FN2 and output from the electric power measurement unit FN2. The filtering unit FN3 is actualized by the first filter FL1 (see FIG. 2) and the second filter FL2 (see FIG. 2) or the like, for example.

The adding operation unit FN4 adds a plurality of measured results by the electric power measurement unit FN2, and calculates the electric power supplied to the motor M. The adding operation unit FN4 is actualized by the adding operator CO (see FIG. 1) or the like, for example.

The diagnostic unit FN5 diagnoses the motor M or the cutter tool CT based on the calculated result calculated by the adding operation unit FN4, in other words, the electric power supplied to the motor M. The diagnostic unit FN5 is actualized by the controller CTL (in particular, the diagnostic unit DI, see FIG. 1) or the like, for example.

As illustrated in FIG. 8, when the diagnostic apparatus 1 includes the filtering unit FN3, the influence of the noises included in the input to the electric power measurement unit FN2 and the output from the electric power measurement unit FN2 can be reduced. The advantage of the diagnostic apparatus 1 of the embodiment is described by comparing with a following comparative example, for example.

Figure 9:
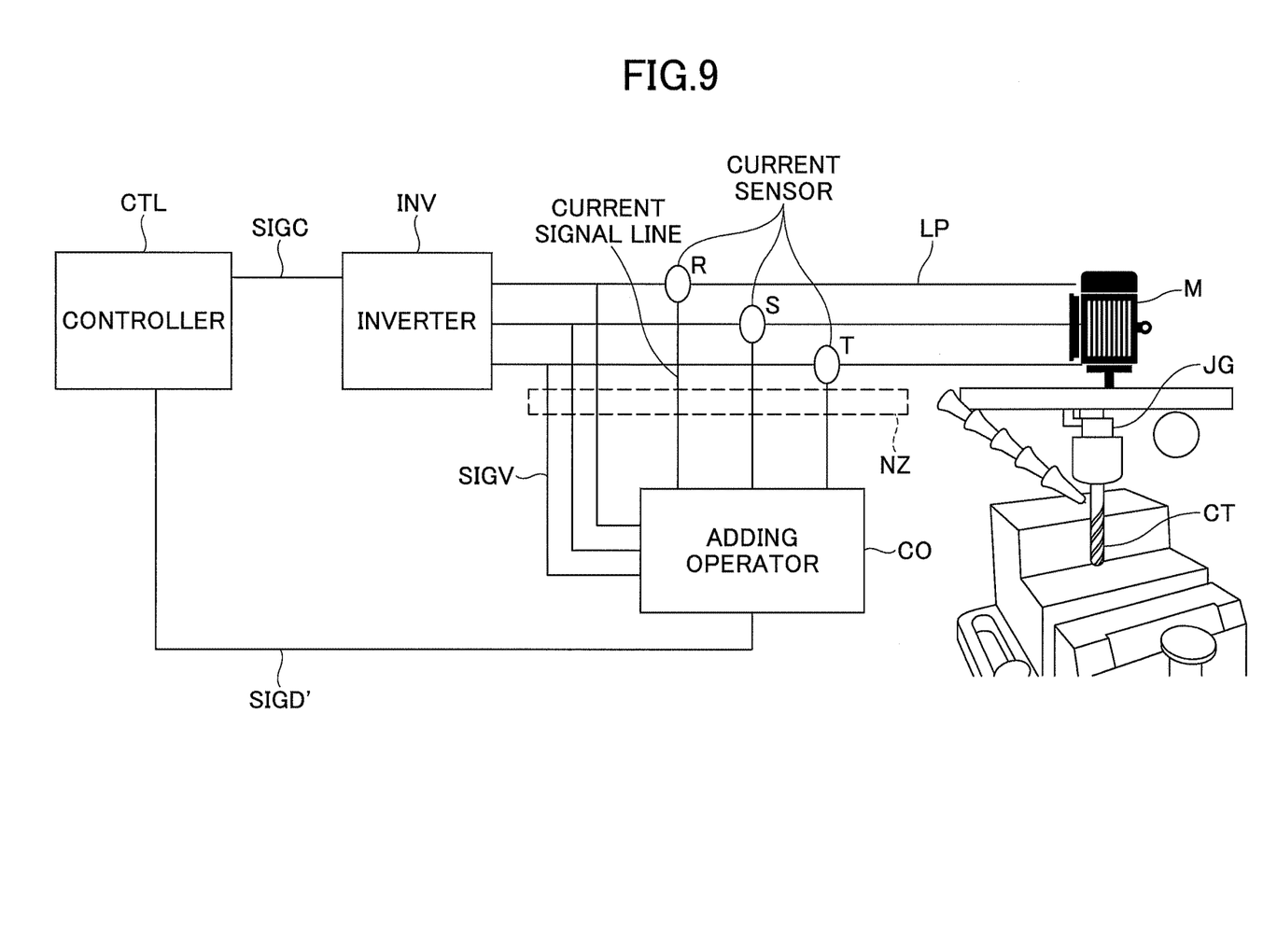
FIG. 9 is a schematic view illustrating an example of an overall structure including a diagnostic apparatus of a comparative example.

FIG. 9 is a schematic view illustrating an example of an overall structure including a diagnostic apparatus of a comparative example. In the comparative example as illustrated, current sensors are provided instead of the electric power sensors SP. Then, current that flows through each of the electric power supply lines LP is detected by the respective current sensor. An adding operator CO calculates electric power of each of the electric power supply lines LP by multiplying the detected current and voltage indicated by a voltage signal SIGV. Then, the adding operator CO adds the calculated electric power of each of the electric power supply lines LP to output a calculated electric power signal SIGD'.

Here, current signal lines and voltage signals tend to be easily affected by noises NZ such as magnetic noise, radio noise and the like. Thus, the noises are included in the calculated result by the adding operator CO, and it may be difficult to accurately diagnose.

In particular, the current sensors often output slight signals. Thus, due to a bad S/N ratio, the diagnostic apparatus cannot accurately diagnose by the noises.

On the other hand, according to the diagnostic apparatus 1 of the embodiment, the influence of the magnetic noise, the radio noise and the like is filtered by the filtering unit FN3, and the noise that enters into the electric power measurement unit FN2 can be reduced. Thus, the influence of the noise in controlling or the like of the rotating machine can be reduced in the diagnostic apparatus 1 of the embodiment. Thus, the diagnostic apparatus 1 can detect a small amount of change of the electric power, and a small change of the cutter tool can be diagnosed. In addition, the electric power can be accurately calculated by using values measured by the electric power sensors SP (see FIG. 1) compared with a case when the values measured by the current sensors are used.

Further, the machine tool of the diagnostic apparatus 1 may be a milling machine, a drilling machine, an NC (Numerical Control) machine or the like, for example. Alternatively, the machine tool may be a lathe or the like.

According to the embodiment, influence of noises in controlling or the like of a rotating machine can be reduced.

Although a preferred embodiment of the diagnostic apparatus has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

Various aspects of the subject-matter described herein are set out non-exhaustively in the following numbered clauses:

1. A diagnostic apparatus that diagnoses a cutter tool included in a rotating machine or the rotating machine based on electric power supplied to the rotating machine, including:

an electric power measurement unit that measures the electric power; and a filtering unit that filters noises that enter from an input side of the electric power measurement unit and from an output side of the electric power measurement unit.

2. The diagnostic apparatus according to clause 1, wherein the electric power measurement unit includes a Hall element, and calculates the electric power from Hall current that flows through the Hall element based on applied voltage to the rotating machine, and magnetic flux generated based on applied current to the rotating machine.

3. The diagnostic apparatus according to clause 2, wherein a magnetism collection core is used to generate the applied current.

4. The diagnostic apparatus according to any one of clauses 1 to 3, wherein the filtering unit includes a first filter that filters a noise included in applied voltage to the rotating machine that is input in the electric power measurement unit, and a second filter, provided at an output side of the electric power measurement unit, that filters a noise entering from the output side.

5. The diagnostic apparatus according to any one of clauses 1 to 4, wherein the filtering unit is configured to filter the noise of 60 to 80 MHz, and 150 MHz to 200 MHz.

6. The diagnostic apparatus according to any one of clauses 1 to 5, wherein the rotating machine is a motor and rotates the cutter tool.

7. The diagnostic apparatus according to any one of clauses 1 to 6, wherein resolution of the electric power measurement unit is less than or equal to 20 μsec.

8. The diagnostic apparatus according to any one of clauses 1 to 8, further including:
   a plurality of the electric power measurement units; and
   an adding operation unit that adds an output from each of the electric power measurement units to calculate electric power input in the rotating machine.

What is claimed is:

1. A diagnostic apparatus that diagnoses a cutter tool included in a rotating machine or the rotating machine, comprising:
   an electric power measurement unit that measures an electric power of an electric power supply line that supplies the electric power to the rotating machine via an inverter or a servo amplifier,
   the electric power measurement unit including a Hall element configured such that
      an applied voltage of the electric power supply line is input to the Hall element to cause a Hall current to flow through the Hall element based on the applied voltage, and
      magnetic flux that is proportional to an applied current of the electric power supply line is applied to a sensor surface of the Hall element,
   the electric power measurement unit calculating the electric power of the electric power supply line based on a Hall voltage output from the Hall element that is proportional to a product of the magnetic flux and the Hall current; and
   a filtering unit that filters noises input from an input side of the electric power measurement unit and an output side of the electric power measurement unit.

2. The diagnostic apparatus according to claim 1, wherein the filtering unit includes
   a first filter that filters a noise included in the applied voltage, and
   a second filter, provided at an output side of the electric power measurement unit, that filters a noise input from the output side.

3. The diagnostic apparatus according to claim 2, wherein the first filter is connected to an input signal line of the Hall element and the second filter is connected to an output signal line of the Hall element.

4. The diagnostic apparatus according to claim 1, wherein a magnetism collection core is used to generate the applied current.

5. The diagnostic apparatus according to claim 1, wherein the filtering unit is configured to filter the noise of 60 MHz to 80 MHz, and 150 MHz to 200 MHz.

6. The diagnostic apparatus according to claim 1, wherein the rotating machine is a motor and rotates the cutter tool.

7. The diagnostic apparatus according to claim 1, wherein resolution of the electric power measurement unit is less than or equal to 20 μsec.

8. The diagnostic apparatus according to claim 1, further comprising:
   a plurality of the electric power measurement units; and
   an adding operation unit that adds an output from each of the electric power measurement units to calculate electric power input in the rotating machine.

9. The diagnostic apparatus according to claim 1,
   wherein the Hall element includes two input terminals and two output terminals, and
   wherein the applied voltage of the electric power supply line is applied between the two input terminals of the Hall element.

10. The diagnostic apparatus according to claim 9,
   wherein the filtering unit includes a first filter that filters a noise included in the applied voltage, and
   wherein the applied voltage of the electric power supply line is applied between the two input terminals of the Hall element via the first filter.

* * * * *